US010339260B2

(12) United States Patent
Laenens et al.

(10) Patent No.: US 10,339,260 B2
(45) Date of Patent: Jul. 2, 2019

(54) METHODOLOGY TO GENERATE GUIDING TEMPLATES FOR DIRECTED SELF-ASSEMBLY

(71) Applicant: ASML Netherlands B.V., Veldhoven (NL)

(72) Inventors: Bart Laenens, Milpitas, CA (US); Sander Frederik Wuister, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 7 days.

(21) Appl. No.: 14/913,670

(22) PCT Filed: Aug. 8, 2014

(86) PCT No.: PCT/EP2014/067086
§ 371 (c)(1),
(2) Date: Feb. 22, 2016

(87) PCT Pub. No.: WO2015/032588
PCT Pub. Date: Mar. 12, 2015

(65) Prior Publication Data
US 2016/0210397 A1 Jul. 21, 2016

Related U.S. Application Data

(60) Provisional application No. 61/874,854, filed on Sep. 6, 2013.

(51) Int. Cl.
G06F 17/50 (2006.01)
G03F 7/00 (2006.01)
G03F 1/36 (2012.01)

(52) U.S. Cl.
CPC ............ G06F 17/5081 (2013.01); G03F 1/36 (2013.01); G03F 7/0002 (2013.01); G06F 17/5009 (2013.01)

(58) Field of Classification Search
CPC .... G06F 17/5081; G06F 17/5009; G03F 1/36; G03F 7/0002
(Continued)

(56) References Cited

U.S. PATENT DOCUMENTS 7,003,758 B2 2/2006 Ye et al.
8,786,824 B2 7/2014 Hansen
(Continued)

FOREIGN PATENT DOCUMENTS

WO 2010/059954 5/2010
WO 2014/191163 12/2014
WO 2015/018590 2/2015

OTHER PUBLICATIONS

International Search Report and Written Opinion dated Dec. 5, 2014 in corresponding International Patent Application No. PCT/EP2014/067086.
(Continued)

Primary Examiner — Stacy Whitmore
(74) Attorney, Agent, or Firm — Pillsbury Winthrop Shaw Pittman LLP

(57) ABSTRACT

A method of determining a characteristic of a guiding template for guiding self-assembly of block copolymer to form an entirety of a design layout, or a portion thereof, including a plurality of design features, each design feature including one or more elemental features, the method including selecting a characteristic of a guiding template for each of the one or more elemental features of the plurality of design features from a database or a computer readable non-transitory medium, the database or the computer readable non-transitory medium storing a characteristic of a guiding template for each of the one or more elemental features, and determining the characteristic of the guiding template to form the entirety of the design layout, or the portion thereof, by combining the selected characteristic of
(Continued)

the guiding template for the one or more elemental features for each of the plurality of design features.

20 Claims, 13 Drawing Sheets

(58) Field of Classification Search
USPC .......................................................... 716/53
See application file for complete search history.

(56) References Cited

U.S. PATENT DOCUMENTS

| | | | | |
|---|---|---|---|---|
| 8,828,871 | B2* | 9/2014 | Zhou | H01L 21/0332 216/12 |
| 9,169,383 | B2* | 10/2015 | Farnham | C08F 6/12 |
| 9,276,056 | B2* | 3/2016 | Akhtar | H01L 23/5227 |
| 2010/0294740 | A1 | 11/2010 | Cheng et al. | |
| 2010/0315614 | A1 | 12/2010 | Hansen | |
| 2011/0209106 | A1 | 8/2011 | Cheng et al. | |
| 2012/0009390 | A1* | 1/2012 | Yang | B81C 1/00031 428/179 |
| 2012/0121160 | A1 | 5/2012 | Matsuoka et al. | |
| 2012/0127454 | A1* | 5/2012 | Nakamura | G03F 7/0002 355/77 |
| 2012/0331428 | A1 | 12/2012 | Cheng et al. | |
| 2013/0318483 | A1 | 11/2013 | Chang et al. | |
| 2014/0377965 | A1* | 12/2014 | Schmid | G03F 7/0002 438/778 |
| 2016/0218032 | A1* | 7/2016 | Millward | B81C 1/00031 |
| 2017/0091369 | A1* | 3/2017 | Yonemitsu | G03F 7/40 |

OTHER PUBLICATIONS

Azat Latypov, "Computational solution of inverse directed self-assembly problem," Proc. of SPIE, vol. 8680, pp. 86800Z-1-86800Z-10 (Mar. 26, 2013).
He Yi et al., "Flexible Control of Block Copolymer Directed Self-Assembly using Small, Topographical Templates: Potential Lithography Solution for Integrated Circuit Contact Hole Patterning," Advanced Materials, vol. 24, pp. 3107-3114 (May 2, 2012).
Tatsuhiro Iwama et al., "Computational studies of shape rectification in directed self-assembly," Proc. of SPIE, vol. 9049, pp. 904927-1-904927-8 (Mar. 27, 2014).
Yuelin Du et al., "Block Copolymer Directed Self-Assembly (DSA) Aware Contact Layer Optimization for 10 nm 1D Standard Cell Library," Proc. of IEEE International Conference on Computer Aided Design (ICCAD), pp. 186-193 (Nov. 18, 2013).
Miri Park et al., "Block Copolymer Lithography: Periodic Arrays of ~ $10^{11}$ Holes in 1 Square Centimeter," Science, vol. 276, pp. 1401-1404 (May 30, 1997).
Chris Spence, "Full-Chip Lithography Simulation and Design Analysis—How OPC Is Changing IC Design," Proc. SPIE, vol. 5751, pp. 1-14 (2005).
Yu Cao et al., "Optimized Hardware and Software for Fast, Full Chip Simulation," Proc. SPIE, vol. 5754, pp. 407-414 (2005).
Alan E. Rosenbluth et al., "Optimum mask and source patterns to print a given shape," J. Microlith., Microfab., Microsyst, vol. 1, No. 1, pp. 13-30 (Apr. 2002).
Yuri Granik, "Source optimization for image fidelity and throughput," J. Microlith., Microfab., Microsyst, vol. 3, No. 4, pp. 509-522 (Oct. 2004).
Robert Socha et al., "Simultaneous Source Mask Optimization (SMO)," Proc. of SPIE, vol. 5853, pp. 180-193 (2005).

* cited by examiner

METHODOLOGY TO GENERATE GUIDING TEMPLATES FOR DIRECTED SELF-ASSEMBLY

CROSS-REFERENCE TO RELATED APPLICATIONS

This application is the U.S. national phase entry of PCT patent application no. PCT/EP2014/067086, which was filed on Aug. 8, 2014, which claims the benefit of priority of U.S. provisional application No. 61/874,854, which was filed on Sep. 6, 2013 and which is incorporated herein in its entirety by reference.

FIELD

The present disclosure relates to a method of designing the formation of a lithography feature by self-assembly of block copolymer.

BACKGROUND

In lithography for device manufacture, there is an ongoing desire to reduce the size of features in a lithographic pattern in order to increase the density of features on a given substrate area. Patterns of smaller features having critical dimensions (CD) at nano-scale allow for greater concentrations of device or circuit structures, yielding potential improvements in size reduction and manufacturing costs for electronic and other devices. In projection photolithography, the push for smaller features has resulted in the development of technologies such as immersion lithography and extreme ultraviolet (EUV) lithography.

An alternative, so-called imprint lithography, generally involves the use of a "stamp" (often referred to as an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

Block Copolymer Self-Assembly

For both projection photolithography and for imprint lithography, it is desirable to provide high resolution patterning of surfaces, for example of a device substrate, of an imprint template or of other substrates. The use of self-assembly of a block copolymer (BCP) has been considered as a potential method for increasing the feature resolution to a smaller dimension than that obtainable by prior lithography methods or as an alternative to prior lithography methods, such as electron beam lithography for preparation of device substrates or imprint templates.

A self-assemblable BCP is a compound useful in nanofabrication because it may undergo an order-disorder transition on cooling below a certain temperature (order-disorder transition temperature To/d) resulting in phase separation of copolymer blocks of different chemical nature to form ordered, chemically distinct domains with dimensions of tens of nanometers or even less than 10 nm. The size and shape of the domains may be controlled by manipulating the molecular weight and composition of the different block types of the copolymer. The interfaces between the domains may have a line width roughness of the order of about 1-5 nm and may be manipulated by modification of the chemical compositions of the blocks of the copolymer.

The feasibility of using a thin film of BCP as a self-assembling template for pattern formation was demonstrated by Chaikin and Register, et al., Science 276, 1401 (1997). Dense arrays of dots and holes with dimensions of 20 nm were transferred from a thin film of poly(styrene-block-isoprene) to a silicon nitride substrate.

A BCP comprises different blocks, each typically comprising one or more identical monomers, and arranged side-by side along the polymer chain. Each block may contain many monomers of its respective type. So, for instance, an A-B BCP may have a plurality of type A monomers in the (or each) A block and a plurality of type B monomers in the (or each) B block. An example of a suitable BCP is, for instance, a polymer having covalently linked blocks of polystyrene (PS) monomer (hydrophobic block) and polymethylmethacrylate (PMMA) monomer (hydrophilic block). Other BCPs with blocks of differing hydrophobicity/hydrophilicity may be useful. For instance a tri-block copolymer such as (A-B-C) BCP may be useful, as may an alternating or periodic BCP e.g. $[-A-B-A-B-A-B-]_n$ or $[-A-B-C-A-B-C]_m$ where n and m are integers. The blocks may be connected to each other by covalent links in a linear or branched fashion (e.g., a star or branched configuration).

A BCP may form many different phases upon self-assembly, dependent upon the volume fractions of the blocks, degree of polymerization within each block type (i.e. number of monomers of each respective type within each respective block), and the optional use of a solvent and surface interactions. When applied in a thin film, geometric confinement may pose additional boundary conditions that may limit the phases formed. In general, spherical (e.g. cubic), cylindrical (e.g. tetragonal or hexagonal) and lamellar phases (i.e. self-assembled phases with cubic, hexagonal or lamellar space-filling symmetry) are practically observed in thin films of self-assembled BCPs.

The phase type observed may depend upon the relative molecular volume fractions of the different polymer blocks. For instance, a molecular volume ratio of 80:20 will provide a cubic phase of discontinuous spherical domains of the low volume block arranged in a continuous domain of the higher volume block. As the volume ratio reduces to 70:30, a cylindrical phase will be formed with the discontinuous domains being cylinders of the lower volume block. At a 50:50 ratio, a lamellar phase is formed. With a ratio of 30:70 an inverted cylindrical phase may be formed and at a ratio of 20:80, an inverted cubic phase may be formed.

Suitable BCPs for use as a self-assemblable polymer include, but are not limited to, poly(styrene-b-methylmethacrylate), poly(styrene-b-2-vinylpyridone), poly(styrene-b-butadiene), poly(styrene-b-ferrocenyldimethylsilane), poly(styrene-b-ethyleneoxide), poly(ethyleneoxide-b-isoprene). The symbol "b" signifies "block". Although these are di-block copolymer examples, it will be apparent that self-assembly may also employ a tri-block, tetra-block or other multi-block copolymer.

One method used to guide or direct self-assembly of a polymer (such as a BCP) onto a substrate surface is known as graphoepitaxy. This method involves the self-organization of a BCP guided by topological pre-patterning on the substrate using one or more features constructed of resist (or one or more features transferred from resist onto a substrate surface, or one or more features transferred onto a film stack deposited on the substrate surface). The pre-patterning is used to form an enclosure or "recess" comprising a substrate base and a sidewall, e.g., a pair of opposing side-walls, of resist (or a side-wall formed in a film or a side-wall formed in the substrate).

Typically, the height of a feature of a graphoepitaxy guiding template is of the order of the thickness of the BCP layer to be ordered, so may be, for instance, from about 20 nm to about 150 nm.

A lamellar self-assembled BCP can form a parallel linear pattern of lithography features with adjacent lines of the different polymer block domains in the recess. For instance if the BCP is a di-block copolymer with A and B blocks within the polymer chain, the BCP may self-assemble into an ordered layer in each recess, the layer comprising regularly spaced first domains of A blocks, alternating with second domains of B blocks.

Similarly, a cylindrical self-assembled BCP can form an ordered pattern of lithography features comprising cylindrical discontinuous first domains surrounded by a second continuous domain. For instance, if the BCP is a di-block copolymer with A and B blocks within the polymer chain, the A block may assemble into a cylindrical discontinuous domain within a circular recess and surrounded by a continuous domain of B block. Alternatively, the A block may assemble into cylindrical discontinuous domains regularly spaced across a linear recess and surrounded by a continuous domain of B block.

Graphoepitaxy may be used, therefore, to guide the self-organization of lamellar or cylindrical phases such that the BCP pattern subdivides the spacing of the side wall(s) of a recess into domains of discrete copolymer patterns.

In a process to implement the use of BCP self-assembly in nanofabrication, a substrate may be modified with a neutral orientation control layer, as part of the graphoepitaxy guiding template, to induce the preferred orientation of the self-assembly pattern in relation to the substrate. For some BCPs used in self-assemblable polymer layers, there may be a preferential interaction between one of the blocks and the substrate surface that may result in orientation. For instance, for a polystyrene(PS)-b-PMMA BCP, the PMMA block will preferentially wet (i.e. have a high chemical affinity with) an oxide surface and this may be used to induce the self-assembled pattern to lie oriented substantially parallel to the plane of the surface. Substantially normal orientation may be induced, for instance, by depositing a neutral orientation layer onto the surface rendering the substrate surface neutral to both blocks, in other words the neutral orientation layer has a similar chemical affinity for each block, such that both blocks wet the neutral orientation layer at the surface in a similar manner. By "normal orientation" it is meant that the domains of each block will be positioned side-by-side at the substrate surface, with the interfacial regions between adjacent domains of different blocks lying substantially perpendicular to the plane of the surface.

In a graphoepitaxy guiding template for aligning a di-block copolymer having A and B blocks, where A is hydrophilic and B is hydrophobic in nature, the graphoepitaxy pattern may comprise hydrophobic side-wall features, with a neutral orientation base between the hydrophobic features. The B domain may preferentially assemble alongside the hydrophobic features, with several alternating domains of A and B blocks aligned over the neutral orientation region between the pinning features of the graphoepitaxy guiding template.

A neutral orientation layer may, for instance, be created by use of random copolymer brushes which are covalently linked to the substrate by reaction of a hydroxyl terminal group, or some other reactive end group, to oxide at the substrate surface. In other arrangements for neutral orientation layer formation, a crosslinkable random copolymer or an appropriate silane (i.e. molecules with a substituted reactive silane, such as a (tri)chlorosilane or (tri)methoxysilane, also known as silyl, end group) may be used to render a surface neutral by acting as an intermediate layer between the substrate surface and the layer of self-assemblable polymer. Such a silane based neutral orientation layer will typically be present as a monolayer whereas a crosslinkable polymer is typically not present as a monolayer and may have a layer thickness of typically less than or equal to about 40 nm, or less than or equal to about 20 nm.

A thin layer of self-assemblable BCP may be deposited onto a substrate having a graphoepitaxy guiding template as set out above. A suitable method for deposition of the self-assemblable polymer is spin-coating, as this process is capable of providing a well-defined, uniform, thin layer of self-assemblable polymer. A suitable layer thickness for a deposited self-assemblable polymer film is approximately 10 nm to 150 nm.

Following deposition of the BCP film, the film may still be disordered or only partially ordered and one or more additional steps may be needed to promote and/or complete self-assembly. For instance, the self-assemblable polymer may be deposited as a solution in a solvent, with solvent removal, for instance by evaporation, prior to self-assembly.

Self-assembly of a BCP is a process where the assembly of many small components (the BCP) results in the formation of a larger more complex structure (the nanometer sized features in the self-assembled pattern). Defects arise naturally from the physics controlling the self-assembly of the polymer. Self-assembly is driven by the differences in interactions (i.e. differences in mutual chemical affinity) between A/A, B/B and A/B (or B/A) block pairs of an A-B BCP, with the driving force for phase separation described by Flory-Huggins theory for the system under consideration. The use of graphoepitaxy may greatly reduce defect formation. The Flory-Huggins interaction parameter (chi value), and the degree of polymerization of the BCP blocks (N value) are parameters of the BCP which affect the phase separation, and the dimensions with which self-assembly of a particular BCP occurs.

For a polymer which undergoes self-assembly, the self-assemblable polymer will exhibit an order-disorder temperature To/d. To/d may be measured by any suitable technique for assessing the ordered/disordered state of the polymer, such as differential scanning calorimetry (DSC). If layer formation takes place below this temperature, the molecules will be driven to self-assemble. Above the temperature To/d, a disordered layer will be formed with the entropy contribution from disordered A/B domains outweighing the enthalpy contribution arising from favorable interactions between neighboring A-A and B-B block pairs in the layer. The self-assemblable polymer may also exhibit a glass transition temperature Tg below which the polymer is effectively immobilized and above which the copolymer molecules may still reorient within a layer relative to neighboring copolymer molecules. The glass transition temperature is suitably measured by differential scanning calorimetry (DSC).

Defects formed during ordering as set out above may be partly removed by annealing. A defect such as a disclination (which is a line defect in which rotational symmetry is violated, e.g. where there is a defect in the orientation of a director) may be annihilated by pairing with other another defect or disclination of opposite sign. Chain mobility of the self-assemblable polymer may be a factor for determining defect migration and annihilation and so annealing may be carried out at a temperature where chain mobility is high but the self-assembled ordered pattern is not lost. This implies temperatures up to a few ° C. above or below the order/disorder temperature To/d for the polymer.

Ordering and defect annihilation may be combined into a single annealing process or a plurality of processes may be used in order to provide a layer of self-assembled polymer such as BCP, having an ordered pattern of domains of differing chemical type (of domains of different block types).

In order to transfer a pattern, such as a device architecture or topology, from the self-assembled polymer layer into the substrate upon which the self-assembled polymer is deposited, typically a first domain type will be removed by so-called breakthrough etching to provide a pattern of a second domain type on the surface of the substrate with the substrate laid bare between the features of the second domain type. A pattern having parallel cylindrical phase domains can be etched using a dry etching or reactive ion etching technique. A pattern having lamellar phase domains can utilize a wet etching technique in addition to or as an alternative to those suitable for the etching of parallel cylindrical phase domains.

Following the breakthrough etching, the pattern may be transferred by so-called transfer etching using an etching means which is resisted by the second domain type and so forms recesses in the substrate surface where the surface has been laid bare.

While the discussion herein focuses on graphoepitaxy guiding templates, it will be appreciated that a guiding template may involve a technology other than, or in addition to, graphoepitaxy. For example, the guiding template may be a chemoepitaxy template involving chemical surface modification of the guiding template, wherein the chemical modification facilitates guiding of the self-assembly. For example, in a chemoepitaxy guiding template for aligning a di-block copolymer having A and B blocks, where A is hydrophilic and B is hydrophobic in nature, the surface of the template may comprise one or more hydrophobic strips with a neutral orientation base between the hydrophobic features. The strips have a similar function as the one of more hydrophobic walls of a graphoepitaxy guiding template.

Optical Proximity Correction (OPC)

As an example, OPC addresses the fact that the final size and placement of one or more features of an image of a design pattern projected on a substrate will not be identical to, or simply depend only on, the size and placement of the one or more features of the design pattern at the patterning device. It is noted that the terms "mask", "reticle", "patterning device" are utilized interchangeably herein. Furthermore, masks and reticles can be broadly termed "patterning devices." Further, a person skilled in the art will recognize that, especially in the context of lithography simulation and optimization, the term "mask," "patterning device" and "design pattern" can be used interchangeably, as in lithography simulation and optimization, a physical patterning device is not necessarily used but a design pattern can be used to represent a physical patterning device. For small feature sizes and/or high feature densities present on some design pattern, the position of a particular edge of a given feature may be influenced to a certain extent by the presence or absence of other adjacent features. These proximity effects arise from minute amounts of radiation coupled from one feature to another and/or non-geometrical optical effects such as diffraction and interference. Similarly, proximity effects may arise from diffusion and other chemical effects during post-exposure bake (PEB), resist development, and etching that generally follow lithography.

In order to help ensure that the projected image of the design pattern is in accordance with requirements of a given target design, proximity effects should be predicted and compensated for, using sophisticated numerical models, corrections or pre-distortions of the design pattern. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design almost every feature of the design pattern has some modification in order to achieve high fidelity of the projected image to the target design. These modifications may include shifting or biasing of edge positions or line widths as well as application of "assist" features that are intended to assist projection of other features.

Application of model-based OPC to a target design involves good process models and considerable computational resources, given the many millions of features typically present in, for example, a chip design. However, applying OPC is generally not an "exact science", but an empirical, iterative process that does not always compensate for all possible proximity effects. Therefore, the effect of OPC, e.g., design patterns after application of OPC and any other resolution enhancement techniques (RET), should be verified by design inspection, e.g. intensive full-chip simulation using calibrated numerical process models, in order to reduce or minimize the possibility of a design flaw being built into the patterning device pattern. This is driven by the enormous cost of making high-end patterning devices, which run in the multi-million dollar range, as well as by the impact on turn-around time by reworking or repairing actual patterning devices once they have been manufactured.

Both OPC and full-chip RET verification may be based on numerical modeling systems and methods as described, for example in, U.S. Pat. No. 7,003,758 and an article titled "Optimized Hardware and Software For Fast, Full Chip Simulation", by Y. Cao et al., Proc. SPIE, Vol. 5754, 405 (2005).

One RET is related to adjustment of the global bias of the design pattern. The global bias is the difference between the features in the design pattern and the features intended to print on the substrate. For example, a circular feature of 25 nm diameter may be printed on the substrate by a 50 nm diameter feature in the design pattern or by a 20 nm diameter feature in the design pattern but with high dose.

In addition to optimization to design patterns or patterning devices (e.g., OPC), the illumination source may be optimized, either jointly with patterning device optimization or separately, in an effort to improve the overall lithography fidelity. The terms "illumination source" and "source" are used interchangeably in this document. Since the 1990s, many off-axis illumination sources, such as annular, quadrupole, and dipole, have been introduced, and have provided more freedom for OPC design, thereby improving the imaging results. Off-axis illumination is a proven way to resolve fine structures (i.e., target features). However, when compared to a traditional illumination source, an off-axis illumination source usually provides less radiation intensity for the aerial image (AI). Thus, it becomes desirable to attempt to optimize the illumination source to achieve the optimal balance between finer resolution and reduced radiation intensity.

Numerous illumination source optimization approaches can be found, for example, in an article by Rosenbluth et al., titled "Optimum Mask and Source Patterns to Print A Given Shape", Journal of Microlithography, Microfabrication, Microsystems 1(1), pp. 13-20, (2002). The source is partitioned into several regions, each of which corresponds to a certain region of the pupil spectrum. Then, the source distribution is assumed to be uniform in each source region and the brightness of each region is optimized for process window. However, such an assumption that the source distribution is uniform in each source region is not always valid, and as a result the effectiveness of this approach suffers. In another example set forth in an article by Granik, titled "Source Optimization for Image Fidelity and Throughput", Journal of Microlithography, Microfabrication, Microsystems 3(4), pp. 509-522, (2004), several existing source optimization approaches are overviewed and a method based on illuminator pixels is proposed that converts the source optimization problem into a series of non-negative least square optimizations. Though these methods have demonstrated some successes, they typically require multiple complicated iterations to converge. In addition, it may be difficult to determine the appropriate/optimal values for some extra parameters, such as γ in Granik's method, which dictates the trade-off between optimizing the source for substrate image fidelity and the smoothness requirement of the source.

For low $k_1$ photolithography, optimization of both the source and patterning device is useful to help ensure a viable process window for projection of critical patterns. Some algorithms (e.g. Socha et. al. Proc. SPIE vol. 5853, 2005, p. 180) discretize illumination into independent source points and patterning device diffraction orders in the spatial frequency domain, and separately formulate a cost function (which is defined as a function of selected design variables) based on process window metrics such as exposure latitude which could be predicted by optical imaging models from source point intensities and patterning device diffraction orders. The term "design variables" as used herein comprises a set of parameters of a lithographic apparatus, for example, parameters a user of the lithographic apparatus can adjust. It should be appreciated that any characteristics of a lithographic process, including those of the source, the patterning device, the projection optics, and/or resist characteristics can be among the design variables in the optimization. The cost function is often a non-linear function of the design variables. Then standard optimization techniques are used to minimize the cost function.

Relatedly, the pressure of ever decreasing design rules have driven semiconductor chipmakers to move deeper into the low $k_1$ lithography era with existing 193 nm ArF lithography. Lithography towards lower $k_1$ puts heavy demands on RET, exposure tools, and the need for litho-friendly design. 1.35 ArF hyper numerical aperture (NA) exposure tools may be used in the future. To help ensure that a design pattern can be produced on the substrate with workable process window, source-patterning device optimization (referred to herein as source-mask optimization or SMO) is becoming a significant RET for 2×nm node.

A source and patterning device optimization method and system that allows for simultaneous optimization of the source and patterning device using a cost function without constraints and within a practicable amount of time is described in PCT Patent Application Publication No. WO 2010/059954, which is hereby incorporated by reference in its entirety.

Another source and mask optimization method and system that involves optimizing the source by adjusting pixels of the source is described in U.S. Patent Application Publication No. 2010/0315614, which is hereby incorporated by reference in its entirety.

SUMMARY

Disclosed herein is a method of determining a characteristic of a joined guiding template for guiding self-assembly of block copolymer to form two or more features in a design layout for lithography, the method comprising: determining a guiding template for each of the two or more features without accounting for the others of the two or more features; and determining a characteristic of the joined guiding template, the joined guiding template being the joining of each of the guiding templates for the two or more features, wherein curvatures on the joined guiding template are not greater than a maximum curvature, the maximum curvature being a function of numerical aperture and of wavelength of radiation, used to transfer a pattern for the joined guiding template onto a substrate.

According to an embodiment, the characteristic of the joined guiding template comprises one or more characteristics selected from: height, shape, spacing, material, and/or surface chemistry.

According to an embodiment, the two or more features comprise one or more features selected from: a contact hole, an isolation trench, a via, a lead, and/or a gate electrode.

Disclosed herein is a method of determining a characteristic of a guiding template for guiding self-assembly of block copolymer to form an entirety of a design layout, or a portion thereof, comprising a plurality of design features, each design feature comprising one or more elemental features, the method comprising: selecting a characteristic of a guiding template for each of the one or more elemental features of the plurality of design features from a database or a computer readable non-transitory medium, the database or the computer readable non-transitory medium storing a characteristic of a guiding template for each of the one or more elemental features; and determining the characteristic of the guiding template to form the entirety of the design layout, or the portion thereof, by combining the selected characteristic of the guiding template for the one or more elemental features for each of the plurality of design features.

According to an embodiment, the selecting comprises searching the database or the computer readable non-transitory medium based on a condition.

According to an embodiment, the condition comprises a characteristic of the self-assembly of the block copolymer and the database or the computer readable non-transitory medium stores the characteristic of the guiding template for each of the one or more elemental features according to the condition.

According to an embodiment, the characteristic of the self-assembly of the block copolymer comprises guiding template critical dimension.

According to an embodiment, the characteristic of the self-assembly of the block copolymer comprise one or more characteristics selected from: chemical composition of the block copolymer, thickness of the block copolymer, annealing temperature of the block copolymer, annealing rate of the block copolymer, and/or solvent for the block copolymer.

According to an embodiment, the condition comprises a characteristic of the one or more elemental features and the database or the computer readable non-transitory medium stores the characteristic of the guiding template for each of the one or more elemental features according to the condition.

According to an embodiment, the characteristic of the one or more elemental features comprises a geometrical characteristic of the one or more elemental features.

According to an embodiment, the geometrical characteristic of the one or more elemental features comprises at least one selected from: size, shape, and/or relative location of the one or more elemental features.

According to an embodiment, the condition comprises a characteristic of a lithographic projection apparatus configured to transfer a pattern for the guiding template onto a substrate and the database or the computer readable non-transitory medium stores the characteristic of guiding template for each of the one or more elemental features according to the condition.

According to an embodiment, the characteristic of the lithographic projection apparatus comprises one or more selected from: wavelength, numerical aperture, polarization, radiation source shape, and/or a characteristic of the projection optics of the lithographic projection apparatus.

According to an embodiment, the method further comprises determining a difference between the design layout and a block copolymer feature self-assembled using the guiding template for guiding self-assembly of block copolymer to form the entirety of the design layout, or the portion thereof.

According to an embodiment, the method further comprises adjusting the guiding template for guiding self-assembly of block copolymer to form the entirety of the design layout, or the portion thereof, when the difference is greater than a threshold.

According to an embodiment, the method further comprises simulating self-assembly of block copolymer using the guiding template for guiding self-assembly of block copolymer to form the entirety of the design layout, or the portion thereof.

According to an embodiment, the method further comprises performing optical proximity correction of the design layout, the characteristic of the guiding template for guiding self-assembly of block copolymer to form the entirety of the design layout, or the portion thereof, and/or a pattern to transfer the guiding template for guiding self-assembly of block copolymer to form the entirety of the design layout, or the portion thereof, onto a substrate.

Also disclosed herein is a database or computer readable non-transitory medium, comprising characteristics of guiding templates for guiding self-assembly of block copolymer therein to form a group of elemental features under one or more conditions stored therein.

According to an embodiment, the one or more conditions comprise one or more of characteristics of the self-assembly of the block copolymer, characteristics of the elemental features, and characteristics of a lithographic projection apparatus configured to transfer the elemental features onto a substrate.

Also disclosed herein is a computer readable non-transitory medium with instructions stored therein, configured to cause a computer to carry out a method as described herein.

Also disclosed herein is a computer apparatus comprising: a memory storing processor readable instructions, and a processor arranged to read and execute instructions stored in the memory, wherein the processor readable instructions comprise instructions arranged to control the computer to carry out a method as described herein.

Also disclosed herein is a guiding template for guiding self-assembly of block copolymer, wherein a characteristic of the guiding template is determined by a method according to a method as described herein.

One or more aspects of the disclosure may, where appropriate to one skilled in the art, be combined with any one or more other aspects described herein, and/or with any one or more features described herein.

BRIEF DESCRIPTION OF THE DRAWINGS

Specific embodiments of the invention will be described with reference to the accompanying Figures, in which.

DETAILED DESCRIPTION

Figure 1A:
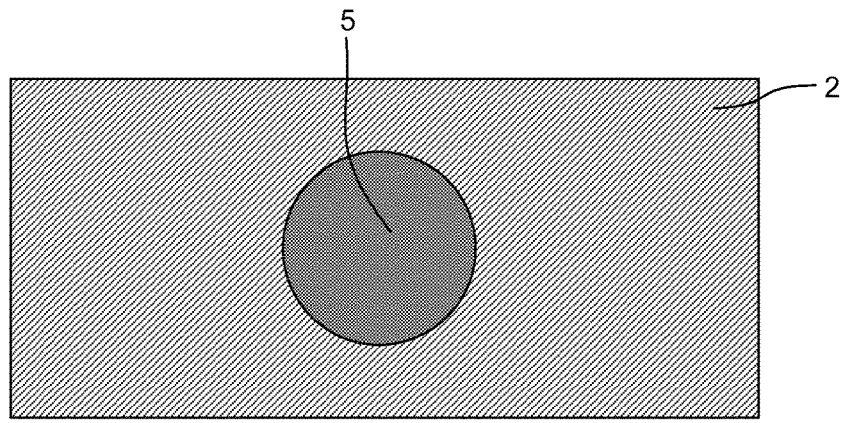
FIGS. 1A-1E schematically depict directed self-assembly of A-B block copolymer on a substrate by a guiding template.
Figure 1B:
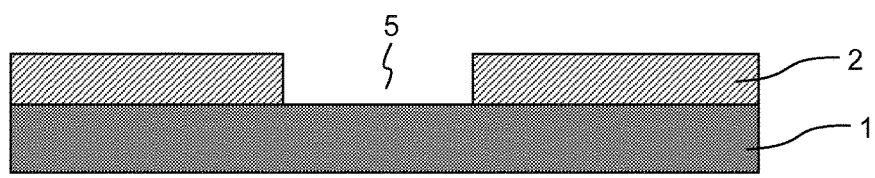

FIGS. 1A and 1B show, in plan view and cross-section respectively, part of a substrate 1 to which a lithography process using self-assembly of BCP is applied. An anti-reflection coating may be present on the surface of the substrate 1. The anti-reflection coating (if present) may be an organic material, such as, for example, ARC 29, from Brewer Science Inc. of Rolla, Mo. The anti-reflection coating may be an inorganic material such as, for example, SiC or SiON. A neutral layer may be provided on the anti-reflection coating. A layer of resist 2 is applied to the substrate 1. The layer of resist 2 may, for example, be a photo-resist. In an embodiment, the resist is a negative tone developed resist (resist developed by an organic developer). This type of resist is typically compatible with the organic solvent used in the spin coating of the block copolymer. The layer of resist 2 is patterned to form a contact hole (via) recess 5 for use in the self-assembly of the block copolymer. The recess 5 may be formed by photolithography, imprint lithography or another lithographic process. For the purposes of the self-assembly, the recess 5 need not be in the resist. For example, the recess 5 may be formed in a lower layer by, e.g., etching through an opening in the resist 2

(such as shown in FIGS. 1A and 1B). Hereafter, for convenience, the recess 5 is described and depicted as being in the resist 2 although it need not be.

Figure 1C:
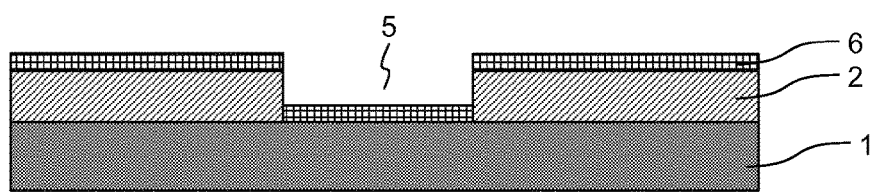
Figure 1D:
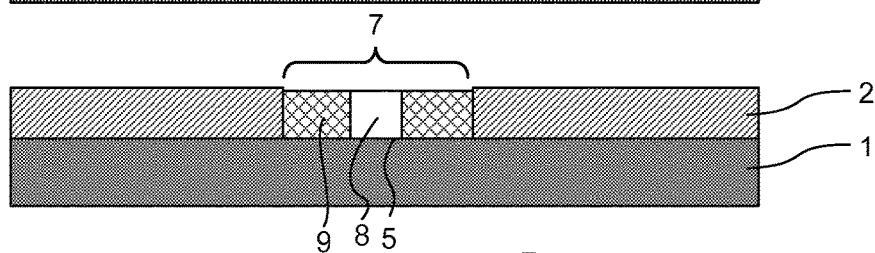
Figure 1E:
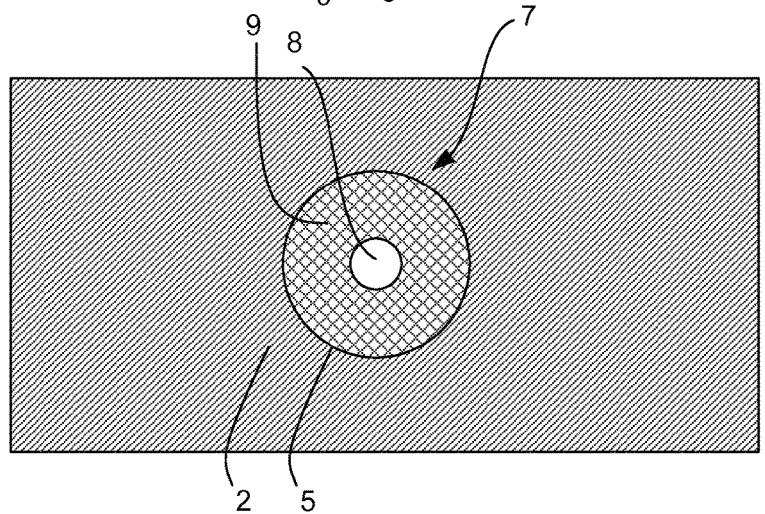

In FIG. 1C, a BCP layer 6 has been deposited onto the substrate 1 and the resist 2. The BCP layer 6 is shown with a uniform thickness within the recess 5, and on top of the resist 2. In FIGS. 1D and 1E, which show cross-section and plan views respectively, the BCP layer 6 has been thermally annealed (thereby causing self-assembly of the BCP material to occur). The thermal annealing process causes a redistribution of the BCP material, with the BCP material being transported from a region above resist 2 into the recess 5. For simplicity all of the BCP material has been depicted as being transported into the recess 5. However, in practice, some BCP material may remain in the region above the resist 2. Solvent annealing may be used instead of thermal annealing (a solvent swells a block copolymer thereby increasing its mobility such that rearrangement of the block copolymer is possible).

The use of a BCP material allows domains of component polymer material to be self-assembled within a BCP feature. For example, the BCP deposited within the recess 5 can be seen to have formed distinct domains of polymer. A type A polymer domain 8 is formed as, for example, a cylinder and is surrounded by a continuous type B polymer domain 9. The type A polymer domain 8 and the type B polymer domain 9 form a BCP feature 7 within the recess 5. In an embodiment, the type B polymer domain 9 is formed as, for example, a cylinder and is surrounded by a continuous type A polymer domain 8.

As noted above, a neutral orientation layer may be provided on the substrate. The neutral orientation layer may have a similar chemical affinity for the type A polymer block and the type B polymer block, such that both blocks wet the neutral orientation layer in a similar manner. This may promote domains of type A and B polymers to form which have a normal orientation (i.e. substantially perpendicular to the surface of the substrate). The neutral orientation layer may have a surface energy which is greater than a surface energy of one of the two polymer domains 8 and 9 and less than a surface energy of the other of the two polymer domains 8 and 9.

To guide the self-assembly, a lateral dimension is controlled by, for example, the spacing of one or more walls. The width (e.g., diameter) of the recess 5 may, for example, be approximately 70 nanometers. The width of the recess 5 may, for example, be in the range of between approximately 20 nanometers and approximately 100 nanometers. The width (e.g., diameter) of the type A polymer domain 8 inside the recess 5 may, for example, be approximately 30 nanometers. The width (e.g., diameter) of the type A polymer domain 8 inside the recess 5 may, for example, be in the range of between approximately 5 nanometers and approximately 50 nanometers.

The BCP material thickness also influences the self-assembly process. The thickness of the BCP layer within the recess 5 may be optimized for the formation of distinct domains of type A and type B polymer.

Figure 2:
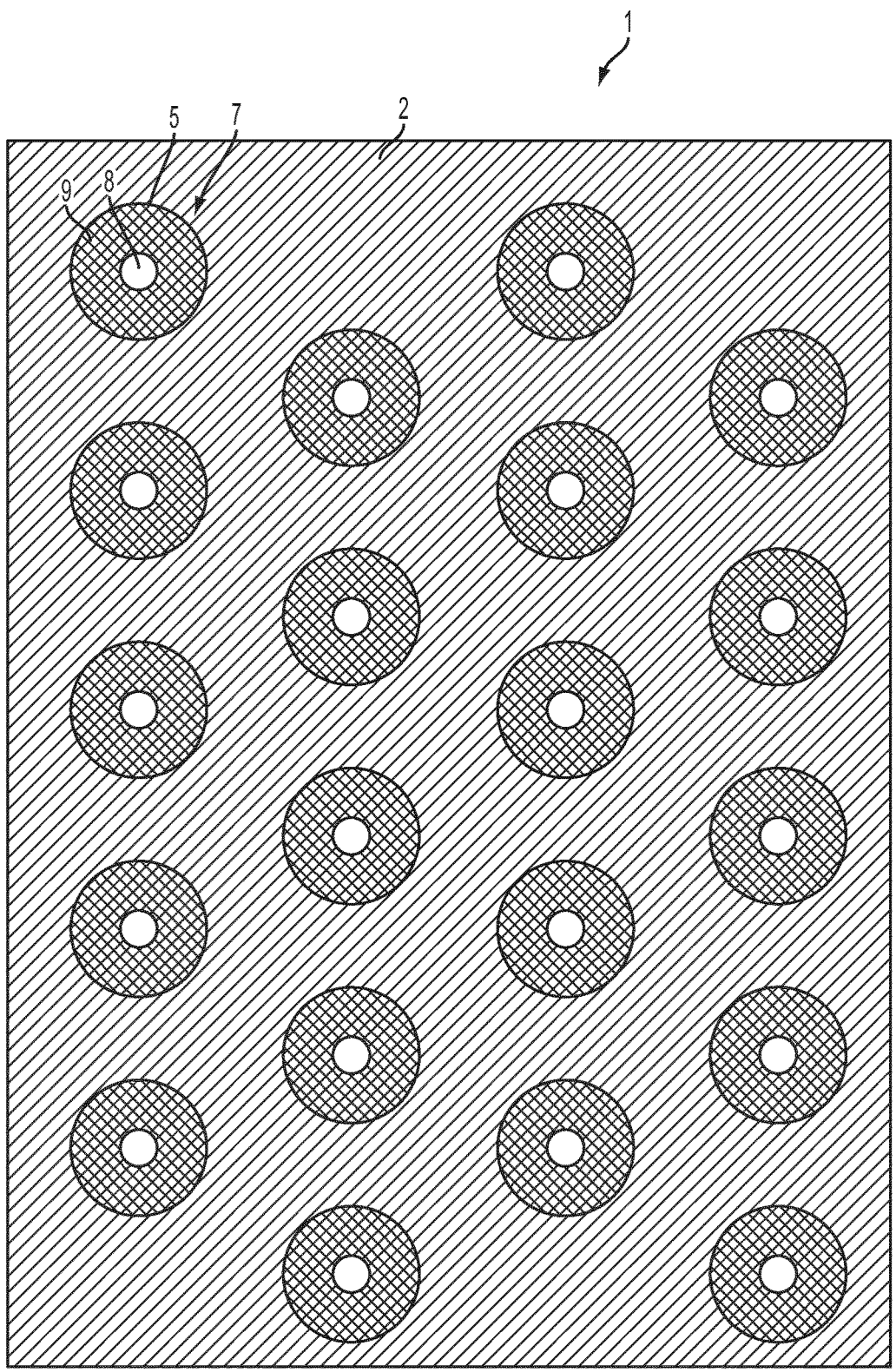
FIG. 2 schematically depicts a plurality of A-B block copolymer features on a substrate.

A plurality of BCP features 7 may be formed on a single substrate 1. For example, a formation of a plurality of cylindrical BCP features (such as the cylindrical BCP feature 7 depicted in FIG. 1), may be formed on a substrate 1. FIG. 2 schematically depicts in plan view a larger part of the substrate 1 to which a lithography process using self-assembly of BCP has been applied. A layer of resist 2 is applied to the substrate 1. The layer of resist 2 is patterned with a plurality of recesses 5. A BCP layer is deposited onto the substrate 1 and a thermal annealing process applied to the BCP layer. A respective BCP feature 7 is formed within each of the recesses 5. The BCP features 7 each comprise a type A polymer domain 8 and a type B polymer domain 9. The type A polymer domain 8 is formed as, for example, a cylinder and is surrounded by the continuous type B polymer domain 9. The type A polymer domain 8 may, for example, comprise blocks of polymethylmethacrylate (PMMA) monomer. The type B polymer domain 9 may, for example, comprise blocks of polystyrene (PS) monomer. Suitable block copolymers for use as self-assemblable polymers include, but are not limited to, poly(styrene-b-methylmethacrylate), poly(styrene-b-2-vinylpyridone), poly(styrene-b-butadiene), poly(styrene-b-ferrocenyldimethylsilane), poly(styrene-b-ethyleneoxide), poly(ethyleneoxide-b-isoprene), poly(styrene-b dimethylsiloxane), poly(styrene-b-lactic acid), poly(dimethylsiloxane-b-lactic acid). The symbol "b" signifies "block". Although these foregoing block copolymers are di-block copolymers, self-assembly may also employ tri-block, tetrablock or other multi-block copolymers.

The BCP feature 7 may further comprise a second type A polymer domain (e.g. blocks of PMMA monomer) positioned around the periphery of the type B polymer domain 9. The second type A polymer domain may, for example, be in contact with the wall(s) of the recess 5. For simplicity the second type A polymer domain is not depicted in the Figures, however it will be appreciated that one or more additional polymer domains other than those depicted may be present in any given BCP feature 7.

The accuracy with which a type A polymer domain is positioned on the substrate is a significant factor in the manufacturing of a device using self-assembly block copolymer. For example a device may be manufactured by patterning a first plurality of features onto the substrate 1. The first plurality of features may, for example, correspond with the type A polymer domains 8 depicted in FIG. 2. This may be achieved, for example, by exposing the resist 2, the type A polymer domains 8 and the type B polymer domains 9 to an etching process. The etching process may remove the type A polymer domains 8. The etching process therefore exposes regions of the substrate 1 below the type A polymer domains 8. The resist 2 and the type B polymer domains 9 may be resistant to the etching process and may remain in place. A further etch process may be performed to etch the exposed regions of the substrate, thereby patterning features into the substrate which correspond with the type A polymer domains 8. These features may for example form contact holes of an integrated circuit.

The resist 2 and the type B polymer domains 9 may subsequently be removed from the substrate and a new layer of resist 2 may be deposited onto the substrate 1. A second plurality of features may then be patterned onto the substrate 1 by forming a second plurality of recesses 5 in the new layer of resist 2. A BCP layer 6 may then be deposited onto the substrate 1 and exposed to an annealing process, thereby forming a second plurality of BCP features 7 comprising a second plurality of type A polymer domains 8. One or more etching processes may then be performed to pattern a second plurality of features onto the substrate 1. The second plurality of features correspond to the second plurality of type A polymer domains 8.

When manufacturing a device using BCP, it is desirable, for example, that a feature of a plurality of features is accurately aligned relative to another of the plurality of features. Additionally or alternatively, it is desirable, for example, that the first plurality of features is accurately aligned relative to the second plurality of features.

In general, a device may be manufactured using other methods and features than those described above. For example a BCP feature having another shape and/or configuration than the uniformly arranged cylindrical shapes depicted in FIGS. 1 and 2 may be patterned onto a substrate. Indeed, while this description considers the example of contact hole formation (e.g., contact hole shrink where a contact hole shape printed with a lithography technique is filled with block copolymer to form the smaller contact hole), the application of the embodiments discussed herein are not limited to contact hole formation.

Figure 3:
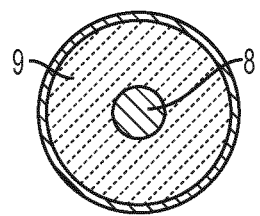
FIG. 3 is a schematic example of the chemical nature of the formation of a single block copolymer feature, such as shown in FIG. 1.

A BCP feature 7 may be simulated as a thermodynamic system and one or more macroscopic properties of the BCP feature may be determined through statistical mechanics. For example, without being bound by any theory, FIG. 3 is a schematic example of the example chemical nature of the formation of a single block copolymer feature, such as shown in FIG. 1. FIG. 3 schematically depicts, in this case, a type A polymer domain 8 formed as, for example, a cylinder and surrounded by continuous type B polymer domain 9 within a recess 5. The type A polymer domain 8 may, for example, comprise polymethylmethacrylate (PMMA) monomer. The type B polymer domain 9 may, for example, comprise polystyrene (PS) monomer. In this case, a second type A polymer domain (e.g. PMMA) is positioned around the periphery of the type B polymer domain 9. The second type A polymer domain is in contact with the wall(s) of the recess 5.

Using self-assembly of BCP in a lithographic process can benefit from a computationally inexpensive method of determining one or more characteristics (e.g., shape, spacing, height, material, surface chemistry, etc.) of a guiding template from a desired pattern to be transferred onto the substrate. Using FIG. 1 as an example, the type A polymer domains 8 may be removed by etching and an area of the substrate below the type A polymer domains 8 may be exposed for further processing (e.g., etching, deposition), thereby transferring the shape of the type A polymer domains 8 onto the substrate. One or more characteristics of the recess 5—the guiding template in this example—affect the position and shape of the type A polymer domains 8, and thus the pattern transferred onto the substrate 1. In a given lithography process (e.g., radiation source shape, wavelength, projection optics in the lithographic projection apparatus, resist, post exposure baking, resist development, etching, deposition, etc.) using a given BCP, for the pattern transferred onto the substrate 1 to be the desired pattern, the recess 5—the guiding template in this example—should possess one or more suitable characteristics.

One method of determining a characteristic of a guiding template from a desired pattern transferred onto the substrate relies on an iterative first-principle calculation of the self-assembly in a guiding template. This method may be accurate but time consuming and computationally expensive, to the extent of potentially involving impractical amounts of computational resources.

According to an embodiment, the time and/or computation costs of this derivation may be reduced by using a rule-based approach. Specifically, one or more characteristics of a guiding template for a group of elemental features under a variety of conditions may be calculated using any suitable method, including rigorous methods such as the iterative first-principle calculation. The group of elemental features may include patterns that are often included in a design layout and/or repetitive patterns in a design layout, such as contact holes, isolation trenches, vias, leads, gate electrodes, etc.

Figure 4:
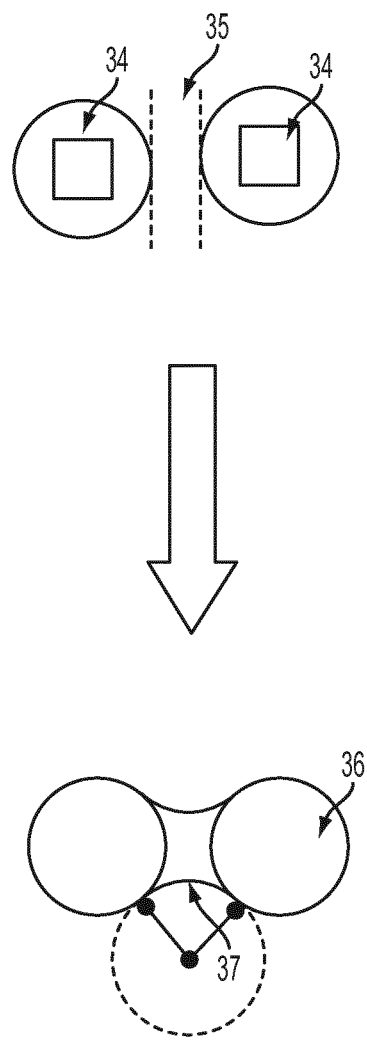
FIG. 4 schematically depicts an example of two features at a patterning device that are too close to be reliably manufactured at the substrate.

According to an embodiment, calculation of the characteristic of a guiding template for the group of elemental features may take into account manufacturability of the group of elemental features at the substrate. In an example schematically depicted in FIG. 4, if the distance 35 between two features 34 (contact holes in this example) is too short to be reliably manufactured at the substrate (e.g., about 30 nm for 193 nm immersion lithography or about 10 nm for EUV lithography), the guiding templates for these features 34 may be merged into a joined guiding template 36, such that no curvature on the joined guiding template 36 is greater than a maximum curvature 37. The maximum curvature $$\kappa_{max} = \frac{4NA}{\lambda},$$

wherein NA is the numerical aperture of the projection optics to project the pattern of the guiding template onto the substrate, and $\lambda$ is the wavelength of the radiation used to project the pattern. $1/\kappa_{max}$ (e.g., minimum radius of the curve) in deep ultraviolet radiation (DUV) lithography using 193 nm is typically about 36 nm. $1/\kappa_{max}$ (e.g., minimum radius of the curve) in extreme ultraviolet radiation (EUV) lithography using 13.5 nm is typically about 10 nm.

Figure 5:
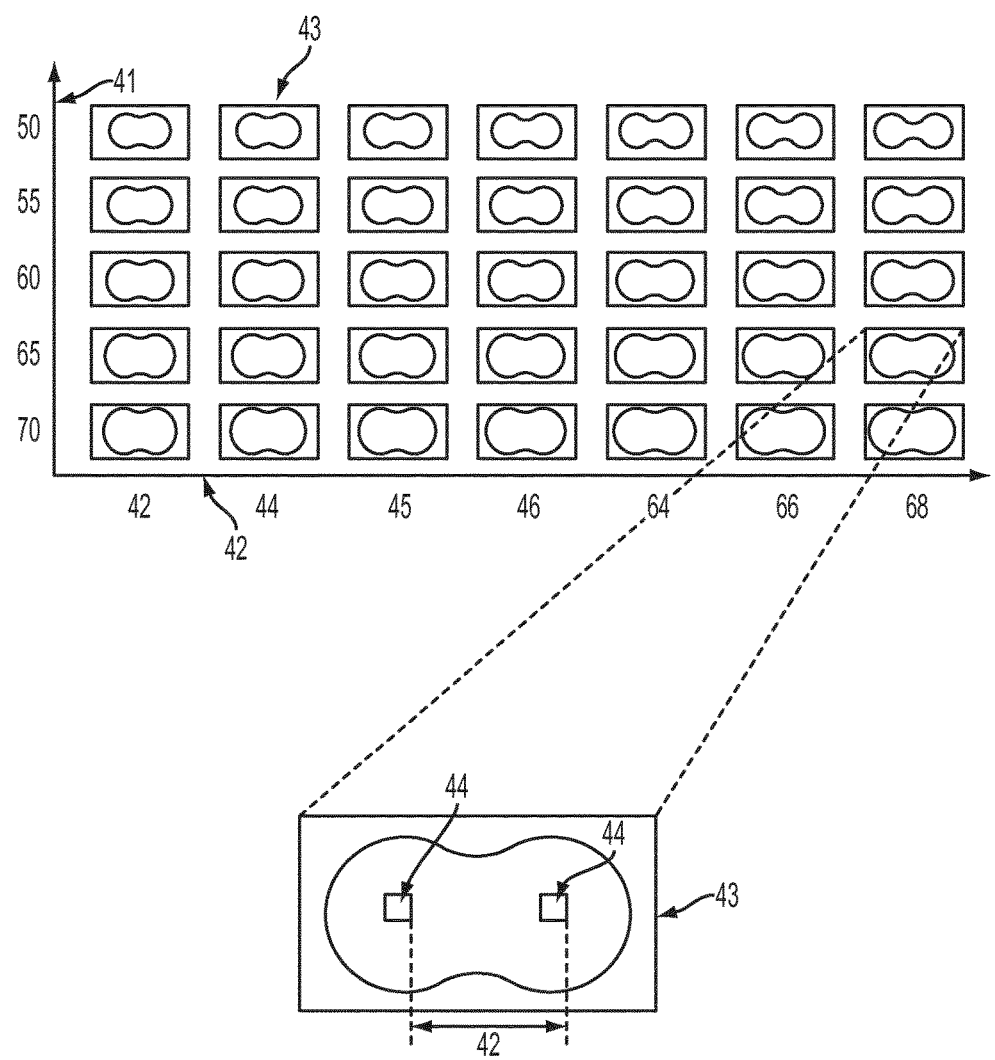
FIG. 5 schematically depicts shapes of guiding templates for an exemplary group of elemental features of two contact holes in close proximity under a variety of conditions.
Figure 6:
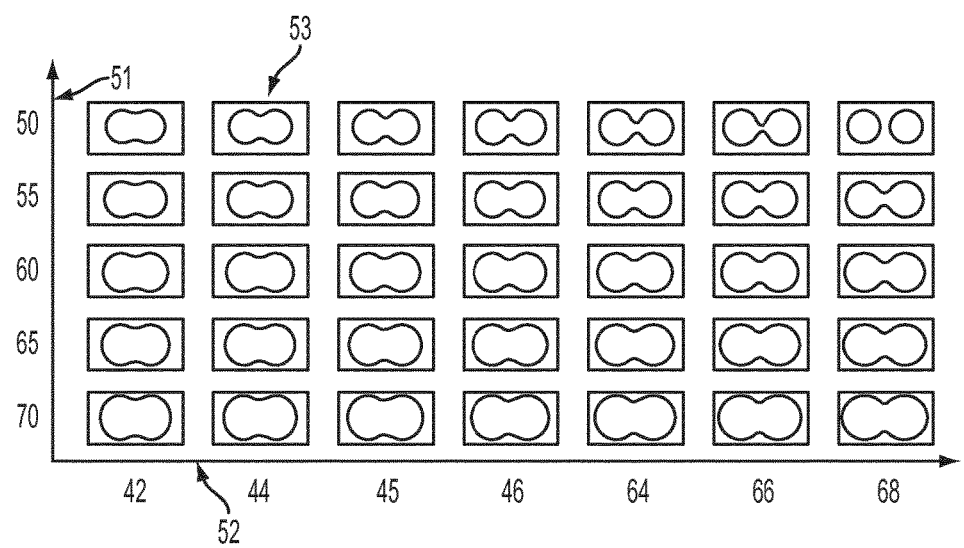
FIG. 6 schematically depicts shapes of guiding templates under the same conditions as in FIG. 5 except under different characteristics of the lithographic projection apparatus.

FIGS. 5 and 6 schematically depict shapes of guiding templates 43, 53 for an exemplary group of elemental features of two contact holes 44 in close proximity under a variety of conditions. FIG. 5 schematically depicts the shapes of guiding templates 43 for an immersion lithographic projection apparatus using 193 nm (DUV) radiation with a numerical aperture of 1.34. FIG. 6 schematically depicts shapes of guiding templates 53 under the same conditions except under different characteristics of the lithographic projection apparatus (in this case, 13.5 nm (EUV) radiation with a numerical aperture of 0.33). The conditions may include one or more characteristics of the self-assembly of the BCP and one or more characteristics of the elemental features.

For example, a characteristic of the self-assembly of the BCP is guiding template critical dimension (CD) 41, 51 (shown in nanometers in FIGS. 5 and 6), which may be a function of one or more other characteristics of the self-assembly of the BCP, such as chemical composition of the BCP, thickness of the BCP layer, annealing temperature and rate of the BCP, solvent for the BCP, etc. The guiding template CD 41, 51 is desirably not a function of any characteristic of the elemental features per se or their relative locations.

For example, a characteristic of elemental features is pitch 42, 52 of the elemental features (shown in nanometers in FIGS. 5 and 6). The pitch 42, 52 is desirably not a function of any characteristics of the self-assembly of the BCP per se. One or more characteristics of the elemental features may be a geometrical characteristic of the elemental features, such as size and/or shape, and/or relative location of the elemental features.

The conditions may include one or more characteristics of the lithographic projection apparatus configured to transfer a pattern for the guiding template onto a substrate, such as wavelength, numerical aperture, polarization, radiation source shape, and one or more characteristics of the projection optics of the lithographic projection apparatus.

After one or more characteristics of guiding templates for a group of elemental features under a variety of conditions are calculated, one or more characteristics of guiding templates for an entirety of a design layout, or a portion thereof, comprising one of more of the elemental features may be determined by combining the one or more characteristics of the guiding templates for this group of elemental features. The one or more characteristics of the guiding templates for this group may be stored in a standalone database or stored in a non-transitory computer readable medium. A computer program may search the group based on one or more conditions.

Figure 7:
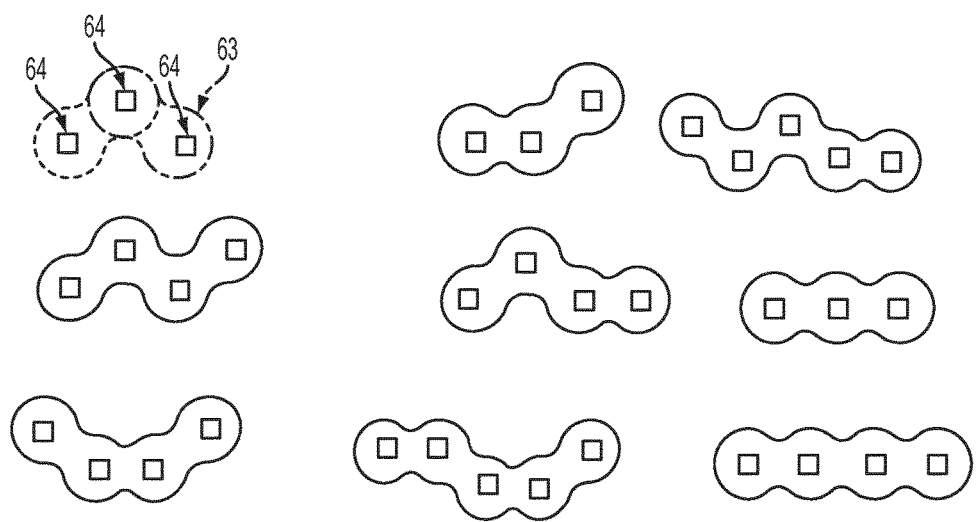
FIG. 7 schematically depicts several exemplary portions of a design layout, each of which has more than two contact holes in close proximity.

FIG. 7 shows several exemplary portions of a design layout, each of which has more than two contact holes 64 in close proximity. Characteristics of the guiding template—shapes and locations in these examples—are determined by combining the characteristics of guiding templates for the group of elemental features illustrated in FIG. 4 or FIG. 5, at suitable guiding template CD and pitch. For example, the two dotted contours are selected from those guiding templates in FIG. 4 or FIG. 5.

The method is not limited to contact holes but is applicable to all other features that could be made using self-assembly of BCP.

Figure 8:
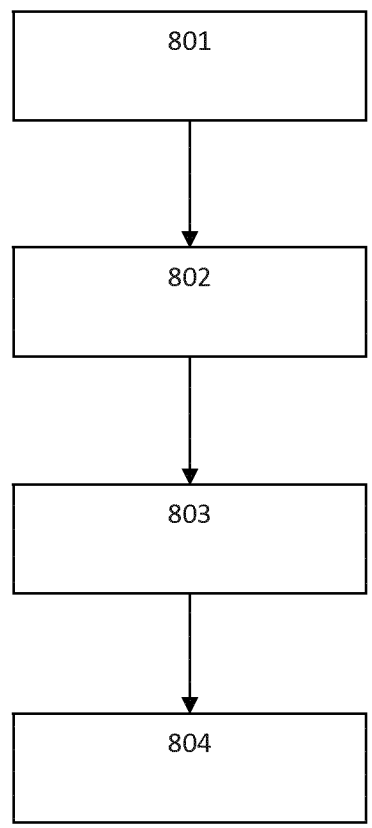
FIG. 8 is a flow chart of a method according to an embodiment.

According to an embodiment, a method of determining one or more characteristics of a guiding template for two or more spatially proximate features on a design layout is shown in the flow chart in FIG. 8. In step 801, a design layout comprising the two or more spatially proximate features is obtained. For example, a full chip design may be analyzed for contact hole constructs, which may be extracted by a suitable algorithm. In step 802, a characteristic of a guiding template for each of the two or more spatially proximate features is determined without accounting for the others of the two or more spatially proximate features. In step 803, a characteristic of a joined guiding template is determined from the characteristic of each guiding template for the two or more spatially proximate features. For example, the guiding template for each of the two or more spatially proximate features may be joined (e.g., merged) into a joined guiding template. In an embodiment, in creating the joined guiding template, the gaps between the respective guiding templates of the two or more spatially proximate features may be bridged and a curvature between the respective guiding templates of the two or more spatially proximate features may be smoothened. In an embodiment, no curvature on the joined guiding template exceeds a maximum curvature that is a function of the wavelength and numerical aperture used in the lithography to form the joined guiding template. In an embodiment, a computer algorithm generates the joined guiding template layout based on (1) a minimum gap between features supported by the lithography process to generate the guiding template, (2) guiding template critical dimension (CD) defined by the self-assembly process and (3) the wavelength and numerical aperture of the lithography process. As discussed further below, the guiding template layout may be used in an OPC process. In an embodiment, the joined guiding template may be determined, e.g., by a look-up in a table such as in FIGS. 5 and 6. Similarly, a joined guiding template may be a combination of two or joined guiding templates, which may be determined, e.g., by a look-up in a table such as in FIGS. 5 and 6. In optional step 804, a characteristic of the joined guiding template is validated using any suitable method including first-principle calculation, to determine a difference between the two or more spatially proximate features and a BCP feature to be formed in the joined guiding template. If the difference is greater than a threshold, the characteristic of the joined guiding template may be adjusted. The validation may not be time consuming or computationally intensive because of the small area involved and the advanced nature of the guiding template.

Figure 9:
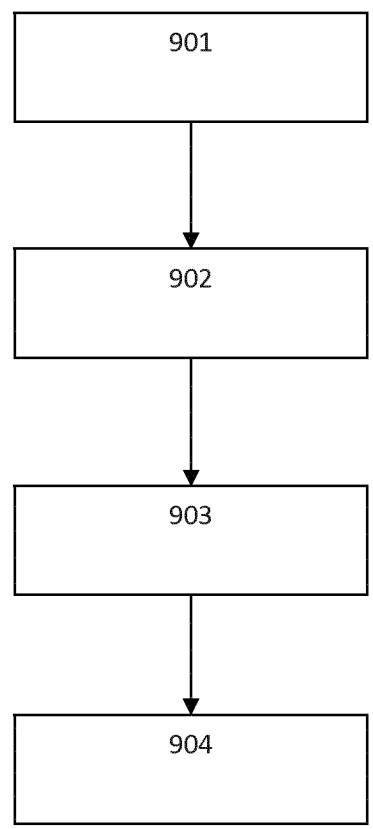
FIG. 9 is a flow chart of a method according to an embodiment.
Figure 10:
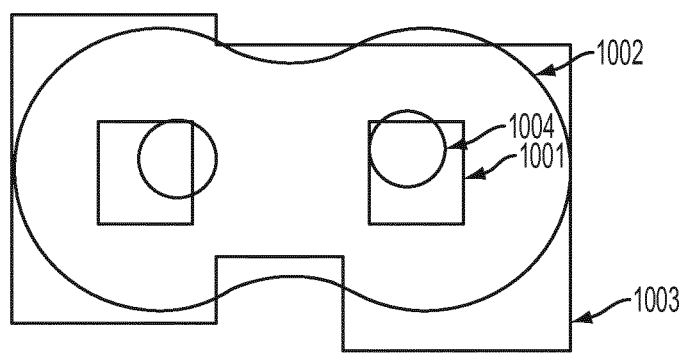
FIG. 10 schematically depicts an example in which a guiding template for several features is optimized by OPC into a pattern for a patterning device.

According to an embodiment, a method of designing a design layout, a guiding template and/or a patterning device pattern for a guiding template is illustrated by the flow chart in FIG. 9. In step 901, a design layout is obtained. For example, a full chip design may be analyzed for contact hole constructs, which may be extracted by a suitable algorithm. In step 902, one or more characteristics of a guiding template for one or more features of the design layout are determined using any suitable method such as a method disclosed herein and/or first-principle calculation. In step 903, the design layout, the one or more characteristics of the guiding template and/or a patterning device pattern to form the guiding template undergo OPC. In an embodiment, the OPC includes simulation of self-assembly of BCP using the guiding template. Thus, in an embodiment, the OPC cost function is 'aware' of the self-assembly process, e.g., the OPC is based on a calibrated lithography and self-assembly model. Even though the guiding template is optimized using OPC, the full chip OPC run time can be decreased by defining a nominal guiding template shape, using a method as discussed herein, that is close to the final optimized guiding template shape. In optional step 904, the design layout, the one or more characteristics of the guiding template and/or the patterning device pattern to form the guiding template, after OPC are verified. In an embodiment, the verification includes simulation of self-assembly of BCP using the guiding template. In an example shown in FIG. 10, a guiding template 1002 for features 1001 as designed is optimized by OPC into a pattern 1003 for a patterning device. Simulation of self-assembly shows the positions 1004 of the features 1001 after OPC is applied to the pattern 1003 to form the guiding template 1002.

Figure 11:
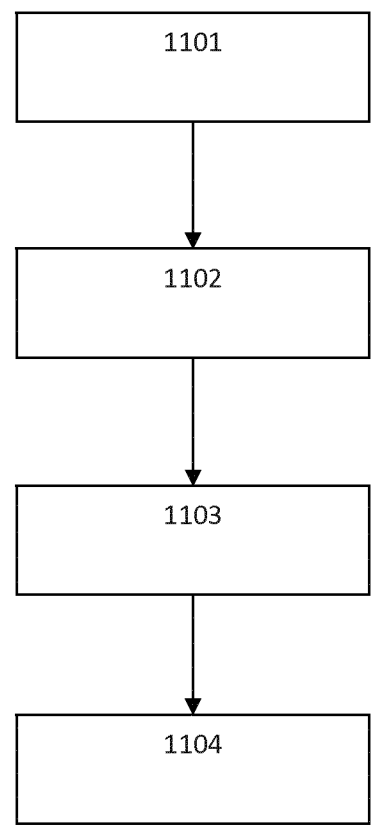
FIG. 11 is a flow chart of a method according to an embodiment.

According to an embodiment, a method of designing a design layout, a guiding template and/or a patterning device pattern for a guiding template is illustrated by the flow chart in FIG. 11. In step 1101, a design layout is obtained. For example, a full chip design may be analyzed for contact hole constructs, which may be extracted by a suitable algorithm. In step 1102, one or more characteristics of a guiding template for one or more features of the design layout are determined using any suitable method such as the methods disclosed herein and/or first-principle calculation. In step 1103, the design layout, the one or more characteristics of the guiding template and/or a patterning device pattern to form the guiding template undergo OPC. In this method, OPC need not include simulation of self-assembly of BCP using the guiding template. In optional step 1104, the design layout, the one or more characteristics of the guiding template and/or the patterning device pattern to form the guiding template, after OPC are verified. In an embodiment, the verification includes simulation of self-assembly of BCP using the guiding template.

Figure 12:
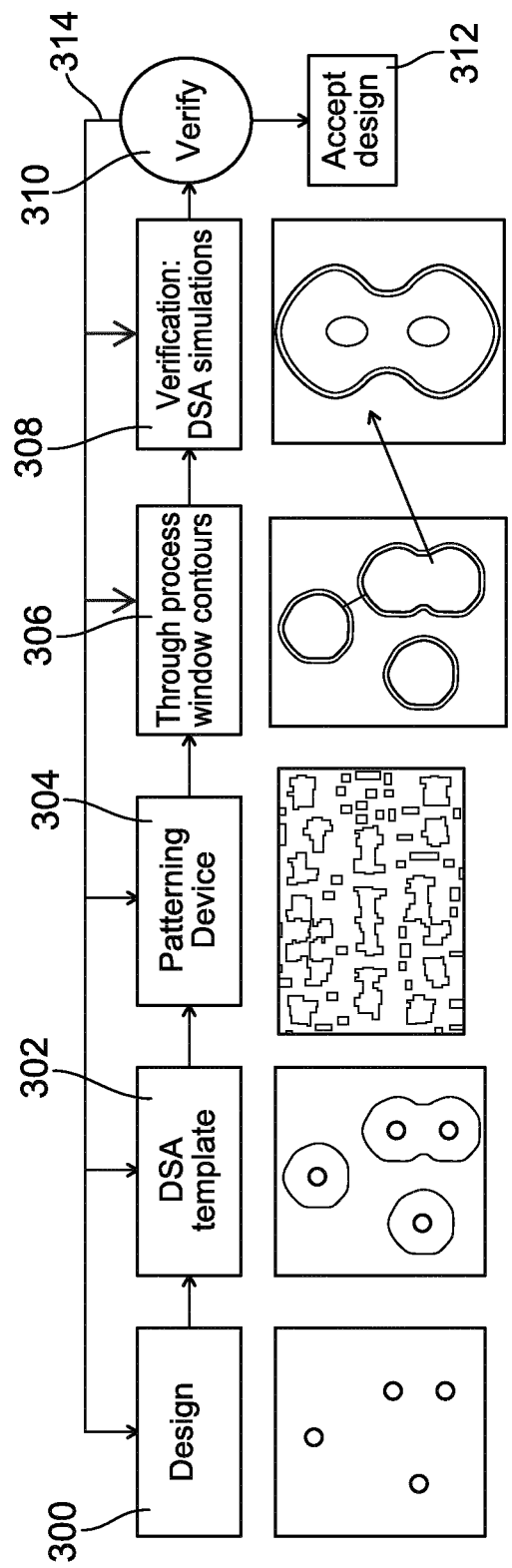
FIG. 12 is a schematic diagram of a method of designing a self-assembly process and its components.

Referring to FIG. 12, an embodiment of a design process is depicted of the design and/or manufacture of a component (e.g., a device) using self-assemblable block copolymer. In this process, a prediction may be made in advance of manufacture of how the block copolymer interacts with the pattern (e.g., printed lithography pattern) used to guide the self-assembly of the block copolymer. Further, the process may enable the calculation of the inverse problem namely knowing where the block copolymer feature should be located, determining, for example, the type of block copolymer that should be used and/or the pattern to be used to guide the self-assembly of the block copolymer.

At step 300, the initial design of the desired arrangement/pattern of the one or more self-assembled block copolymer features is provided. There may also be one or more constraints (rules) provided with respect to in what manner the initial design may be redesigned during the process. Such one or more rules may indicate, for example, by how much particular block copolymer features may shift and still be satisfactorily located. At step 300, the particular block copolymer to be used may be provided. There may also be one of more constraints (rules) provided with respect to in what manner the block copolymer may be redesigned during the process. Such one or more rules may indicate, for example, by how much the ratio of one polymer of the block copolymer may change with respect to another polymer of the block copolymer, whether one or more polymers may be added to, removed from or substituted in the block copolymer, etc.

At step 302, the design for the guiding template on the substrate that is used to guide the self-assembly of the block copolymer is determined. A directed self-assembly block copolymer model is used to translate the initial design to a directed self-assembly block copolymer guiding template, such as the one or more methods/models discussed herein. There may be one of more constraints (rules) with respect to in what manner the guiding template may be designed or redesigned during the process. Such one or more rules may indicate, for example, by how much a portion of a wall of a recess of the guiding template may be near another portion of the wall or another wall, etc. In an embodiment, the directed self-assembly block copolymer model for guiding template design is a fast model or set of rules that does not rely significantly on computationally heavy simulations. In an embodiment of a fast model or set of rules for guiding template design, the model may include a plurality of different standard block copolymer feature patterns and an associated guiding template recess shape for each such pattern to form that pattern. The model can then analyze the input desired block copolymer feature pattern to identify one or more of the plurality of different standard block copolymer feature patterns and then add the associated guiding template recess shape to the overall guiding template recess shape design. For example, as seen in FIG. 12, the isolated contact holes in the design at step 300 can be identified and associated round guiding templates are added to the guiding template design at step 302. Similarly, the pair of adjacent contact holes in the design at step 300 can be identified and an arrangement of joined guiding templates (as discussed herein) may be added to the guiding template design at step 302. In an embodiment, the fast model or set of rules for guiding template design does not perform any simulations but rather exclusively relies on look-up and/or formula calculations. In an embodiment, the fast model or set of rules for guiding template design is a rule-based model, i.e., it relies, similar to rule-based OPC, on simple geometric rules to determine the designs and/or modifications which are to be applied as distinguished from relying on extensive lithography simulation and iteration to make the designs and/or modifications (like model-based OPC).

At step 304, the pattern of a patterning device (e.g., of an imprint template, of an optical lithography mask, of electron beam writer, etc.) used to create the guiding template on the substrate used to guide the self-assembly of the block copolymer is determined. And, at step 306, the transfer and printing of the patterning device pattern is simulated/calculated to arrive at the printed guiding template on the substrate used to guide the self-assembly of the block copolymer. One or more known computational lithography products, such as the ASML Tachyon computational lithography software products, can be used to calculate the pattern and simulate/calculate the transfer and printing of the pattern. For example, where the patterning device is an optical lithography mask, an optical proximity correction product can be used to calculate the mask pattern for the mask, including applying one or more reticle enhancement techniques (RET) such as scatter bars, serifs, etc., and a source-mask optimization (SMO) can optimize or match the illumination parameters with the mask pattern, all with the aim to print the pattern of the patterning device into the desired guiding template on the substrate used to guide the self-assembly of the block copolymer template. There may be one of more constraints (rules) with respect to the manner in which the pattern of the patterning device and/or transferring and printing (e.g., the resist choice, the illumination, etc.) of the patterning device pattern may be designed or redesigned during the process.

At step 308, the printed pattern determined at step 306 is verified. For example, a placement error verification analysis may be performed for the simulated/calculated self-assembly of block copolymer applied to the printed pattern determined at step 306. In an embodiment, the placement error of one or more block copolymer features is simulated and/or calculated using one or more of the methods described in, e.g., U.S. patent application U.S. 61/862,853, filed Aug. 6, 2013 and/or U.S. patent application U.S. 61/829,118 filed May 30, 2013, which are each incorporated herein in their entirety by reference, and compared to a threshold to determine whether the placement of the one or more block copolymer features is acceptable. In an embodiment, the placement error threshold is less than or equal to 5 nm, less than or equal to 4, less than or equal to 3 nm, less or equal to 2 nm, or less than or equal to 1 nm. A directed self-assembly block copolymer model is used to quantify and validate the printed one or more block copolymer features and optionally determine the expected dimensions of the one or more self-assembled block copolymer features. In an embodiment, the directed self-assembly block copolymer model is a fast model or set or rules that does not rely significantly on computationally heavy simulations. In an embodiment of a fast model or set of rules, the placement error and/or dimensions of various single block copolymer features (e.g., a contact hole of varying size) is calibrated based on rigorous and/or substrate simulations for various given block copolymers.

At point 310, if it is determined that the printed pattern is acceptable (e.g., within a threshold such as the placement error is within a threshold), the design and one or more associated self-assembly parameters (e.g., block copolymer type, self-assembly guiding template design, etc.) may be accepted at 312 and self-assembly may proceed using, for example, the design for the guiding template, the block copolymer selected during the design process, etc.

If it is determined that the printed pattern determined at step 306 is not acceptable, the design and/or one or more associated self-assembly parameters (e.g., block copolymer type, self-assembly guiding template design, etc.) may be modified at 314. The modifications can take numerous forms and at various junctions in the computational design process depicted in FIG. 12. In an embodiment, two or more parameter adjustments may need to be co-optimized and one or more of those parameters may be weighted more heavily than another. For example, an adjustment may involve adjustment of the shape of the guiding template and adjustment of a physical parameter of the block copolymer and thus the amount by which either parameter is adjusted may be performed using any known optimization technique, with or without weighting the adjustment of the shape of the guiding template higher or lower than adjustment of the physical parameter of the block copolymer. Any of these adjustments may be made based on, e.g., the amount of placement error of the BCP feature or an associated parameter (e.g., the offset amount and/or the length of the polymer type).

In an embodiment, the adjustment of the design and/or one or more associated self-assembly parameters may comprise adjusting a physical parameter of the block copolymer. For example, adjusting the physical parameter may comprise adjusting a ratio between the amount of a first polymer type and a second polymer type in the block copolymer. In an embodiment, adjusting the physical parameter comprises adding a further polymer type to or removing a polymer type from the block copolymer. In an embodiment, adjusting the physical parameter may comprise adjusting the length of a polymer type of the block copolymer. In an embodiment, adjusting the physical parameter may comprise adjusting a repellence between the first polymer type and the second polymer type or between the second polymer type and a portion of a guiding template to guide the self-assembly of the block copolymer of the block copolymer feature. The adjustment to the block copolymer may be made, for example, at step 308 and then the process proceeds from step 308 using the adjusted block copolymer. Alternatively, the adjustment to the block copolymer may be made, for example, at step 302 if the template design step involves the physical nature of the block copolymer and then the process proceeds from step 302 using the adjusted block copolymer.

In an embodiment, the adjustment of the design and/or one or more associated self-assembly parameters may comprise adjusting a design of the pattern of the patterning device (e.g., of an imprint template, of an optical lithography mask, of electron beam writer, etc.) used to create the guiding template on the substrate used to guide the self-assembly of the block copolymer is determined. For example, for an optical mask, one or more reticle enhancement techniques, such as a serif or a scatter bar, may be applied to the mask pattern. Additionally or alternatively, the adjustment of the design and/or one or more associated self-assembly parameters may comprise adjusting a parameter of the transfer and printing of the patterning device pattern. For example, for an optical mask, the illumination shape, illumination intensity, etc. may be adjusted. These adjustments may be made, for example, at step 304 and/or 306 and then the process proceeds therefrom using the applicable adjustment(s).

In an embodiment, the adjustment of the design and/or one or more associated self-assembly parameters may comprise adjusting a design of a guiding template to guide the self-assembly of the block copolymer of the block copolymer feature. In an embodiment, adjusting the guiding template comprises adjusting a shape of a recess portion of the template. For example, one or more template enhancement techniques, similar to reticle enhancement technique, may be applied to the guiding template pattern. Alternatively or additionally, a different fundamental guiding template shape may be applied to a particular block copolymer feature than previously applied. For example, a heavily overlapping double circle recess guiding template shape or a square recess shape may be applied in the guiding template design at step 302 for an isolated contact hole of the design shown in step 300 instead of a round recess shape as shown in the template design at step 302. These adjustments may be made, for example, at step 302 and then the process proceeds therefrom using the applicable adjustment(s).

In an embodiment, the adjustment of the design and/or one or more associated self-assembly parameters may comprise adjusting the design of the pattern of block copolymer features shown at step 300. In other words, the fundamental design of the block copolymer features may need to be redesigned because perhaps the features are too close to each other to be practically created. Thus, for example, the layout of the pattern of block copolymer features may be changed in terms of feature size, feature pitch, feature layout, etc. These adjustments may be made, for example, at step 300 and then the process proceeds therefrom using the applicable adjustment(s).

In an embodiment, the adjustment of the design and/or one or more associated self-assembly parameters may comprise adjusting a repellence of a portion of a guiding template to guide the self-assembly of the block copolymer of the block copolymer feature, to the first polymer type and/or the second polymer type.

While the design process has been described in terms of realizing a desired arrangement/pattern of one of self-assembled block copolymer features, the process may be augmented to further include simulation and/or modelling of subsequent process steps such as etching, etc. The results of such further process steps may be fed back or fed forward into the process as appropriate to further refine the initial design, the type of block copolymer, the guiding template used to guide the self-assembly of the block copolymer, etc.

One or more of the techniques and/or features described in U.S. patent application publication no. 2012/0331428, which is incorporated herein its entirety by reference, may incorporated in a method as described herein.

The term type A polymer domain should not be limited to a specific type of polymer domain. The terms type A polymer domain and type B polymer domain are used solely to differentiate between different polymer domains with reference to the Figures.

A recess, BCP feature, and/or first domain shape other than cylindrical as described above may be used (e.g., simulated and designed) according to an embodiment. For example, a spherical, elliptical, rectangular, lamellar, cubic, tetragonal or hexagonal feature shape may be simulated and designed using the uncertainty in the positioning of a polymer domain within the feature. Cylindrical features which are joined by a linear trench-like feature may be simulated and designed using polymer domain feature position uncertainties.

As noted above, the use of resist to form a sidewall of a recess is intended to be an example, rather than a limiting feature. For example, a recess may be provided by patterning of the substrate itself, or patterning of a layer deposited or grown onto the substrate. A recess may itself be provided by the self-assembly of BCP material.

Figure 13:
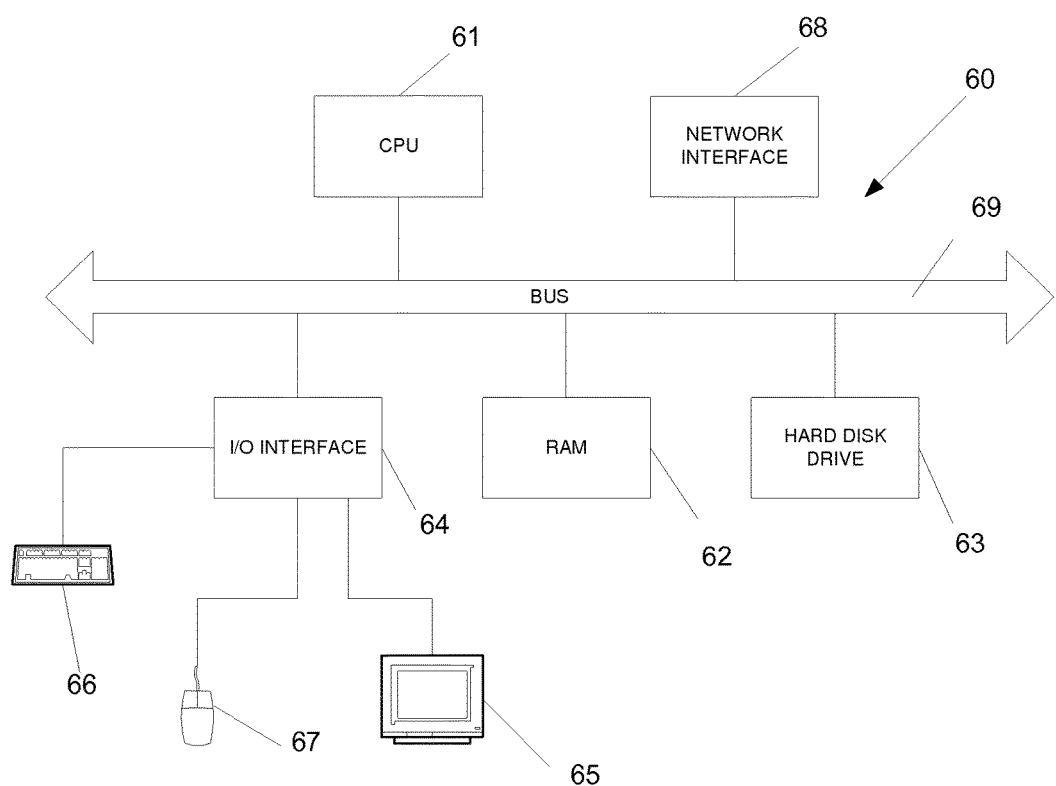
FIG. 13 is a schematic depiction of a computer suitable for implementing an embodiment.

FIG. 13 shows a computer 60. The computer 60 may implement any of the methods described herein including implement a simulation of a BCP feature and/or calculate a guiding template using any of the methods described herein. The computer 60 comprises a CPU (central processing unit) 61 which is configured to read and execute instructions stored in a memory 62 which may take the form of a random access memory. The memory 62 stores instructions for execution by the CPU 61 and data used by those instructions. For example, in use, a digital representation of a BCP feature and/or associated parameters (e.g., the block copolymer types, the BCP feature design shape, etc.) may be stored in the memory 62, together with instructions suitable for causing the computer to carry out a method as described herein.

The computer 60 may further comprise storage, for example, in the form of a hard disc drive 63. The digital representation of the BCP feature and/or the associated parameters may be stored on the hard disc drive 63. The computer 60 may further comprise an I/O (input/output) interface 64 to which is connected one or more peripheral devices used in connection with the computer 60. For instance, a display 65 may be provided so as to display output from the computer 60. The display 65 may, for example, display a representation of the BCP feature. Additionally, the display 65 may display one or more images generated by processing of the simulated BCP feature, or a design of a substrate such as shown in FIG. 2. One or more input devices may be connected to the interface 64. Such an input device may include a keyboard 66 and/or a mouse 67 which allows user interaction with the computer 60.

A network interface 68 may be provided to allow the computer 60 to be connected to an appropriate computer network so as to receive and/or transmit data from and to other computing devices. The CPU 61, memory 62, storage 63, I/O interface 64 and network interface 68, are connected together by a bus 69.

Aspects of the invention can be implemented in any convenient form. For example, an embodiment may be implemented by one or more appropriate computer programs which may be carried on an appropriate carrier medium which may be a tangible carrier medium (e.g. a disk) or an intangible carrier medium (e.g. a communications signal). Embodiments of the invention may be implemented using suitable apparatus which may specifically take the form of a programmable computer running a computer program arranged to implement a method as described herein.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the appended claims.

What is claimed is:

1. A method comprising:
    determining a guiding template for each of two or more features in a design layout without accounting for the others of the two or more features;
    determining, by a hardware computer system, a characteristic of a joined guiding template for guiding a physical process of self-assembly of block copolymer to form the two or more features, the joined guiding template being the joining of each of the guiding templates for the two or more features, wherein curvatures on the joined guiding template are not greater than a maximum curvature, the maximum curvature being a function of numerical aperture and of wavelength of radiation, of the process to produce the joined guiding template; and
    producing electronic data, using the determined characteristic, to setup and/or modify an aspect of a physical equipment or process to produce the joined guiding template on a substrate and/or of the physical process of self-assembly of block copolymer.

2. The method of claim 1, wherein the characteristic of the joined guiding template comprises one or more characteristics selected from: height, shape, spacing, material, and/or surface chemistry.

3. The method of claim 1, wherein the two or more features comprise one or more features selected from: a contact hole, an isolation trench, a via, a lead, and/or a gate electrode.

4. A method comprising:
    selecting a characteristic of a guiding template, for guiding self-assembly of block copolymer, for each of one or more elemental features of a plurality of design features of a design layout from a database or a computer readable non-transitory medium, wherein the selecting comprises searching the database or the computer readable non-transitory medium based on a condition comprising a characteristic of a lithographic projection apparatus configured to transfer a pattern for the guiding template onto a substrate;
    determining, by a hardware computer system, the characteristic of a guiding template to form an entirety of the design layout, or a portion thereof, by combining the selected characteristic of the guiding template for the one or more elemental features for each of the plurality of design features; and
    producing electronic data, using the determined characteristic, to setup and/or modify an aspect of a physical equipment or process to produce the guiding template to form the entirety of the design layout, or the portion thereof, on a substrate and/or of a physical process of self-assembly of block copolymer using the guiding template.

5. The method of claim 4, wherein the condition comprises a characteristic of the self-assembly of the block copolymer and the database or the computer readable non-transitory medium stores the characteristic of the guiding template for each of the one or more elemental features according to the condition.

6. The method of claim 5, wherein the characteristic of the self-assembly of the block copolymer comprises guiding template critical dimension.

7. The method of claim 5, wherein the characteristic of the self-assembly of the block copolymer comprise one or more characteristics selected from: chemical composition of the block copolymer, thickness of the block copolymer, annealing temperature of the block copolymer, annealing rate of the block copolymer, and/or solvent for the block copolymer.

8. The method of claim 4, wherein the condition comprises a characteristic of the one or more elemental features and the database or the computer readable non-transitory medium stores the characteristic of the guiding template for each of the one or more elemental features according to the condition.

9. The method of claim 8, wherein the characteristic of the one or more elemental features comprises a geometrical characteristic of the one or more elemental features.

10. The method of claim 9, wherein the geometrical characteristic of the one or more elemental features comprises at least one selected from: size, shape, and/or relative location of the one or more elemental features.

11. The method of claim 4, wherein the database or the computer readable non-transitory medium stores the characteristic of the guiding template for each of the one or more elemental features according to the condition.

12. The method of claim 11, wherein the characteristic of the lithographic projection apparatus comprises one or more selected from: wavelength, numerical aperture, polarization, radiation illumination shape, and/or a characteristic of the projection optics of the lithographic projection apparatus.

13. The method of claim 4, further comprising determining a difference between the design layout and a block copolymer feature self-assembled using the guiding template for guiding self-assembly of block copolymer to form the entirety of the design layout, or the portion thereof.

14. The method of claim 13, further comprising adjusting the guiding template for guiding self-assembly of block copolymer to form the entirety of the design layout, or the portion thereof, when the difference is greater than a threshold.

15. The method of claim 4, further comprising simulating self-assembly of block copolymer using the guiding template for guiding self-assembly of block copolymer to form the entirety of the design layout, or the portion thereof.

16. The method of claim 4, further comprising performing optical proximity correction of (i) the design layout, (ii) the characteristic of the guiding template for guiding self-assembly of block copolymer to form the entirety of the design layout, or the portion thereof, and/or (iii) a pattern to transfer the guiding template for guiding self-assembly of block copolymer to form the entirety of the design layout, or the portion thereof, onto a substrate.

17. A computer readable non-transitory medium with instructions stored therein, configured to cause a computer to at least:
  determine a guiding template for each of two or more features in a design layout without accounting for the others of the two or more features;
  determine a characteristic of a joined guiding template for guiding self-assembly of block copolymer to form the two or more features, the joined guiding template being the joining of each of the guiding templates for the two or more features, wherein curvatures on the joined guiding template are not greater than a maximum curvature, the maximum curvature being a function of numerical aperture and of wavelength of radiation, used to transfer a pattern for the joined guiding template onto a substrate; and
  producing electronic data, using the determined characteristic, to setup and/or modify an aspect of a physical equipment or process to produce the joined guiding template on a substrate and/or of a physical process of self-assembly of block copolymer using the joined guiding template.

18. A computer readable non-transitory medium comprising instructions stored therein, the instructions configured to cause a computer system to at least:
  select a characteristic of a guiding template, for guiding self-assembly of block copolymer, for each of one or more elemental features of a plurality of design features of a design layout from a database or memory, wherein the selection comprises searching the database or the computer readable non-transitory medium based on a condition comprising a characteristic of a lithographic projection apparatus configured to transfer a pattern for the guiding template onto a substrate; and
  determine the characteristic of a guiding template to form an entirety of the design layout, or a portion thereof, by combining the selected characteristic of the guiding template for the one or more elemental features for each of the plurality of design features; and
  producing electronic data, using the determined characteristic, to setup and/or modify an aspect of a physical equipment or process to produce the guiding template to form the entirety of the design layout, or the portion thereof, on a substrate and/or of a physical process of self-assembly of block copolymer using the guiding template.

19. The computer readable medium of claim 18, wherein the characteristic of the lithographic projection apparatus comprises one or more selected from: wavelength, numerical aperture, polarization, radiation illumination shape, and/or a characteristic of the projection optics of the lithographic projection apparatus.

20. The computer readable medium of claim 18, wherein the instructions are further configured to cause the computer system to simulate self-assembly of block copolymer using the guiding template for guiding self-assembly of block copolymer to form the entirety of the design layout, or the portion thereof.

* * * * *